United States Patent
Reich et al.

(10) Patent No.: US 8,624,580 B2
(45) Date of Patent: Jan. 7, 2014

(54) CONFIGURABLE MEASURING DEVICE WITH DISPLAY AND CORRESPONDING METHODS

(75) Inventors: Friedrich Reich, Stadtbergen (DE); René Muessig, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 602 days.

(21) Appl. No.: 12/866,696

(22) PCT Filed: Jan. 8, 2009

(86) PCT No.: PCT/EP2009/000061
§ 371 (c)(1), (2), (4) Date: Nov. 15, 2010

(87) PCT Pub. No.: WO2009/097944
PCT Pub. Date: Aug. 13, 2009

(65) Prior Publication Data
US 2011/0050208 A1    Mar. 3, 2011

(30) Foreign Application Priority Data
Feb. 8, 2008  (DE) .......................... 10 2008 008 138

(51) Int. Cl.
*G01R 13/20* (2006.01)
*G09G 5/22* (2006.01)

(52) U.S. Cl.
USPC ........ 324/121 R; 324/115; 702/67; 345/440.1

(58) Field of Classification Search
None
See application file for complete search history.

(56) References Cited

U.S. PATENT DOCUMENTS

| | | | |
|---|---|---|---|
| 4,763,067 A * | 8/1988 | Fladstol | ................... 324/121 R |
| 4,821,030 A * | 4/1989 | Batson et al. | ................. 345/173 |
| 5,633,997 A | 5/1997 | Barber | |
| 5,920,297 A | 7/1999 | Alexander | |
| 6,229,536 B1 | 5/2001 | Alexander | |
| 6,571,185 B1 | 5/2003 | Gauland | |

(Continued)

FOREIGN PATENT DOCUMENTS

| | | |
|---|---|---|
| DE | 10250183 A1 | 5/2003 |
| DE | 10 2006 023 914 A1 | 11/2007 |

(Continued)

OTHER PUBLICATIONS

International Preliminary Examination Report mailed May 21, 2010, in corresponding International Patent Application No. PCT/EP2009/000061, filed Jan. 8, 2009.
International Search Report mailed Apr. 21, 2009, in corresponding International Patent Application No. PCT/EP2009/000061, filed Jan. 8, 2009.

*Primary Examiner* — Minh N Tang
(74) *Attorney, Agent, or Firm* — Christensen O'Connor Johnson Kindness PLLC

(57) ABSTRACT

The measuring machine according to the invention has a display device, a processing device, and at least one measurement channel. The processing device measures the measurement signal of the at least one measurement channel. The display device displays the measurement signal of the at least one measurement channel as a chart. A plurality of charts can thereby be displayed at once. The display device additionally displays preview charts. The preview diagrams are scaled representations of the diagrams. The plurality of diagrams can be displayed cascaded and/or horizontally tiled and/or vertically tiled. The multiple plots can be displayed at different, preferably arbitrary positions of the display device.

34 Claims, 6 Drawing Sheets

(56) References Cited

U.S. PATENT DOCUMENTS

| | | |
|---|---|---|
| 6,791,545 B2 | 9/2004 | Miller |
| 2001/0000964 A1 | 5/2001 | Alexander |
| 2002/0154118 A1 | 10/2002 | McCarthy |
| 2003/0169257 A1 | 9/2003 | Alexander |
| 2004/0267470 A1 | 12/2004 | Fender |
| 2007/0038397 A1 | 2/2007 | Rule |
| 2007/0271067 A1* | 11/2007 | Cohn et al. .................. 702/183 |
| 2009/0265126 A1 | 10/2009 | Freidhof |

FOREIGN PATENT DOCUMENTS

| | | |
|---|---|---|
| EP | 0 216 414 A1 | 4/1987 |
| EP | 0 267 722 A2 | 5/1988 |
| EP | 0 955 547 A2 | 11/1999 |
| EP | 1 569 239 A1 | 8/2005 |
| WO | 2006/017160 A2 | 2/2006 |
| WO | 2006/050613 A1 | 5/2006 |
| WO | 2006/115517 A2 | 11/2006 |

* cited by examiner

CONFIGURABLE MEASURING DEVICE WITH DISPLAY AND CORRESPONDING METHODS

FIELD OF THE DISCLOSURE

The invention relates to a multi-channel measuring device, especially an oscilloscope and a corresponding measurement method.

BACKGROUND

Switching between different channels of measuring devices is conventionally implemented with dedicated keys allocated to the individual channels. However, this frequently leads to operating errors, because an allocation of the signal connected to the respective channel is not possible without further difficulty. Only an actual measurement and display of the respective signal allows the type of signal to be recognized, and thus allows an allocation. Accordingly, an operational error is frequent, and an avoidance of such an error occupies a significant amount of the user's time.

U.S. Pat. No. 6,791,545 B2 shows an oscilloscope and a corresponding measurement method, which allow a preview of the anticipated displays of the oscilloscope. However, only a preview of different measurement methods is shown, for example, a histogram measurement or an amplitude measurement. The connection of several different signals to the oscilloscope and the display of associated preview images is not disclosed.

Furthermore, DE 10 2006 023 914 A1 discloses a measuring device, which displays preview displays of several different signals simultaneously. In this context, however, the display of the reduced displays of the diagrams is provided in a separate display region. This leads to a reduced display of the diagrams. Moreover, the different diagrams cannot be positioned freely. The diagrams can only be arranged at predetermined positions of the display. Furthermore, a superimposed display of diagrams, which allows comparisons of the signals, is not shown.

SUMMARY

The invention is based upon the object of providing a measuring device and a measurement method, which allow a rapid, reliable measurement of the signals on several different channels of a measuring device. In particular, an unambiguous allocation of the respective signals to the channels of the measuring device and a very good legibility of the measured results are important in this context.

The object is achieved according to the invention for the measuring device by the features of the independent claim 1 and for the measurement method by the features of the independent claim 19. Advantageous further developments form the subject matter of the dependent claims referring back to these claims.

The measuring device according to the invention provides a display device, a processing unit and at least one measurement channel. The processing unit measures the measurement signal of the at least one measurement channel. The display device displays the measurement signal of the at least one measurement channel as diagrams. In this context, several diagrams can be displayed simultaneously. The display device additionally displays preview diagrams. The preview diagrams are reduced displays of the diagrams. The several diagrams can be displayed superimposed and/or side by side and/or one below the other. The several diagrams can be displayed at different, preferably arbitrary positions of the display device. Accordingly, the anticipated image of each diagram can be read from the preview diagram. An evaluation of the measured values is possible before displaying the diagram. A large volume of information can be displayed simultaneously. Comparisons between different diagrams are possible. Switching to and fro between different diagrams can be avoided. Great flexibility of use is possible as a result of the arbitrary positioning.

The processing unit preferably derives several diagrams from the measurement signal of the at least one measurement channel. Accordingly, different displays of a signal are possible, which leads to a very clear overview and a large volume of displayable information.

The processing unit preferably measures several measurement signals of several measurement channels. Accordingly, different signals can be compared with one another.

The processing unit advantageously derives one measurement signal simultaneously from the measurement signals of several measurement channels. Accordingly, for example, sums or differences of several available signals can be displayed in a common diagram. This increases the legibility of the information for the user and reduces the number of additional processing steps.

The preview diagrams are preferably hidden as required. Space for the display of the diagrams can therefore be obtained on the display device.

The preview diagrams are preferably simplified displays of the diagrams. The preview diagrams are advantageously real-time images of the diagrams. Accordingly, a clear overview of the preview diagrams can be achieved, because the reduced diagrams, the preview diagrams, contain less information than the diagrams. Furthermore, the real-time display allows a reliable estimate of the anticipated diagram.

The selection of the diagrams to be displayed is preferably implemented by selecting the corresponding preview diagrams. In the case of an already implemented display of the associated diagram, a re-selection of a preview diagram, preferably triggers a removal of the associated diagram from the display device. Accordingly, before displaying different diagrams, a selection of the diagram to be observed is possible. An overview of several preview diagrams allows the user a simple and rapid selection. A simple intuitive choice of the diagram is guaranteed in this manner.

By preference, the arrangement of the diagrams on the display device is implemented by positioning of the preview diagrams at given positions of the display device. Accordingly, the subdivision of the display device can be adjusted in an intuitive manner. A training of the user of the measuring device is not required.

The display device is preferably a touch-sensitive screen. The selection and positioning of the preview diagrams on the display device can preferably be implemented by touching and displacement of the preview diagrams. Accordingly, the subdivision of the diagrams on the display device can be adjusted in a particularly simple manner. A safe and intuitive allocation of the diagrams to the signals is guaranteed.

The measuring device preferably provides a pointing instrument (mouse). The selection and positioning of the preview diagrams can preferably be implemented by selection and displacement of the preview diagrams with the pointing instrument. Accordingly, the user can make use of the very widely available input instrument for arranging the diagrams on the display device. This therefore guarantees a simple and intuitive operation.

By preference, the positioning of the diagrams is implemented by selection and displacement of the preview diagrams to given regions of the display device or to given regions of already displayed diagrams. A displacement of a preview diagram on the display device, without a previous display of a diagram, preferably brings about the display of a diagram corresponding to the preview diagram over largely the entire display device. A displacement of a preview diagram to the middle of an already displayed first diagram preferably brings about a superimposition of the first diagram and of the second diagram corresponding to the preview diagram. A displacement of a preview diagram to the edge of an already displayed first diagram preferably brings about a reduction of the first diagram and a display of the second diagram corresponding to the preview diagram in the area freed by the reduction. The reduction is preferably implemented in such a manner that the display of the second diagram takes place at the side of the edge of the first diagram, to which the preview diagram has been displaced. This guarantees an unambiguous arrangement of the diagrams, which can be readily comprehended by the user. A simple and rapid operation of the measuring device is possible.

With the display of a diagram, the preview diagram corresponding to the respective diagram is preferably hidden or replaced by configuration parameters. In this manner, a safe allocation of the displayed diagrams to the channels of the measuring device is guaranteed. Furthermore, configuration parameters of the displayed signals can be read off and readily allocated by the user.

The display device advantageously displays the preview diagrams with a degree of transparency determined by processing unit. The display device preferably displays the preview diagrams superimposed over the diagrams. Accordingly, the visibility of the complete signals of the different diagrams is guaranteed. By contrast with a display of the preview diagrams in their own separate region of the display device, the diagrams can be displayed in an enlarged manner, which improves the overview and legibility.

Moreover, the measuring device preferably provides an operating unit with at least one operating element. Each displayed diagram is preferably displayed in a color distinguishable from the colors of the displays of the other diagrams. The at least one operating element can advantageously be illuminated and/or backlit with colors at least similar to the colors of the diagrams. In this manner, a very simple allocation of the operating element to individual displayed diagrams is possible.

The operating unit of the measuring device preferably provides several operating elements. The several operating elements can preferably be illuminated and/or backlit with colors at least similar to the colors of the diagrams. Precisely one diagram displayed by the measuring device is preferably an active diagram. The last positioned or changed diagram is preferably the active diagram. At least one operating element is preferably illuminated or backlit in a color similar to the color of the active diagram. Accordingly, a simple allocation of the respective operating elements to the currently active diagram is possible.

The active diagram can preferably be changed by selecting a diagram on the display device. With a change of the active diagram, the illumination or backlighting of at least one operating element preferably changes to a color similar to the color of the active diagram. This guarantees that the correct operating elements are always illuminated or backlit in the color of the currently active diagram.

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

DESCRIPTION OF THE DRAWINGS

The foregoing aspects and many of the attendant advantages of various aspects of the present invention will become more readily appreciated as the same become better understood by reference to the following detailed description, when taken in conjunction with the accompanying drawings, wherein.

DETAILED DESCRIPTION

Figure 1:
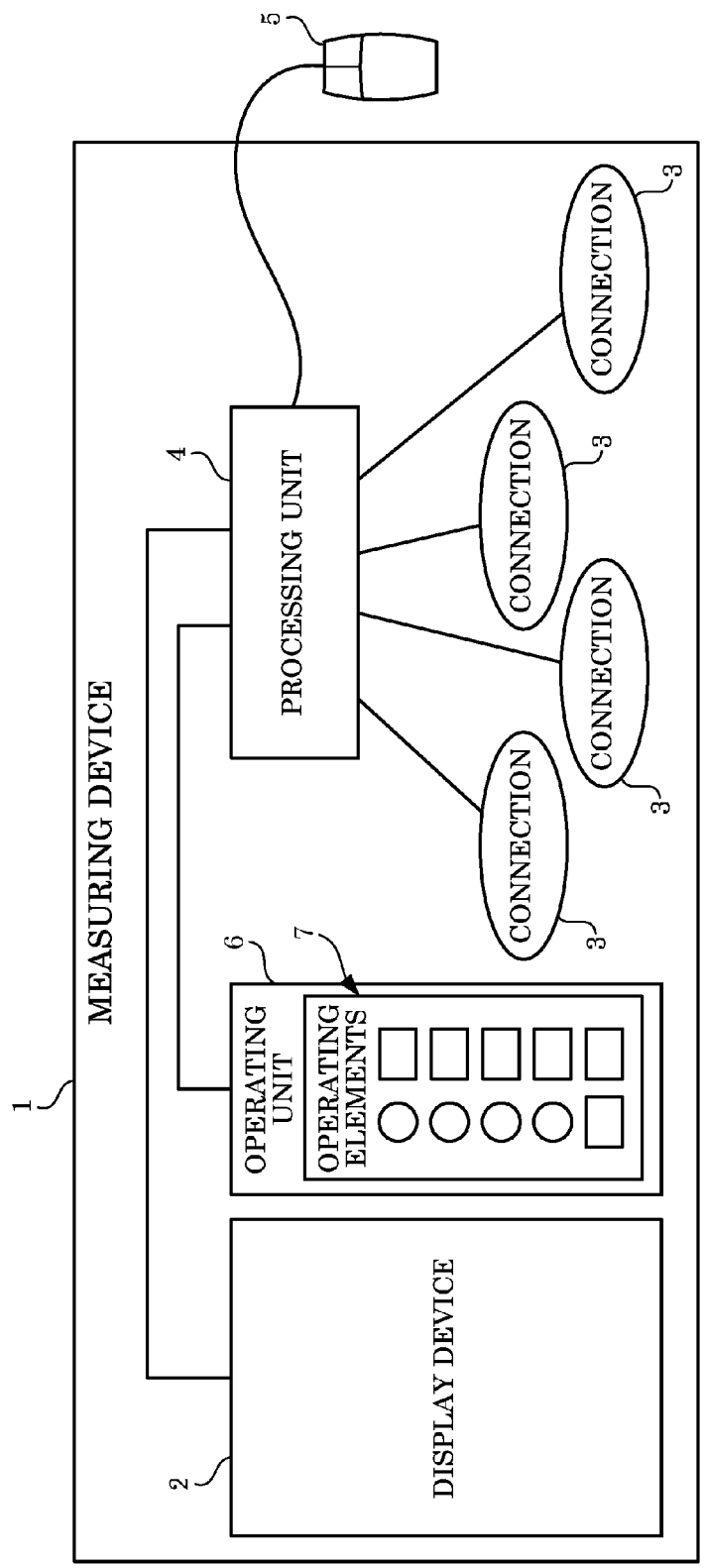
FIG. 1 provides a view of an exemplary measuring device.

With reference to FIG. 1, the general structure of a measuring device is outlined. The structure and functioning of the measuring device according to the invention and the functioning of the measurement method according to the invention are shown with reference to FIGS. 2-10. In some cases, a presentation and description of identical elements in similar drawings has not been repeated.

FIG. 1 provides a view of an exemplary measuring device 1. A measuring device 1 provides a display device 2, a processing unit 4 and a plurality of channels. A single-channel embodiment of the measuring device is also conceivable. Signals are transmitted via a plurality of connections 3 to the measuring device 1. The processing unit 4 measures the signals and displays the measured results in the form of diagrams on the display device 2. The processing unit 4 also implements calculations on the measured results occurring before the display by the display device 2. Accordingly, for example, a combination of several measurement signals to form one measurement signal is conceivable. The measuring device 1 is controlled by means of a pointing instrument 5 and an operating unit 6 with several operating elements 7. Furthermore, a control of the measuring device 1 through the touch-sensitive display device 2 is possible.

Figure 2:
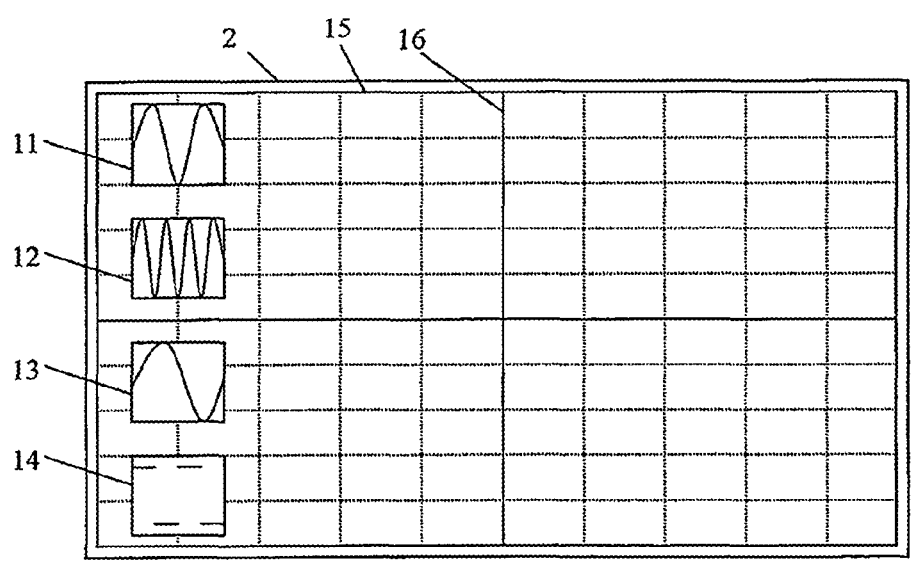
FIG. 2 provides a view of the display device of a first exemplary embodiment of the measuring device according to the invention.

FIG. 2 provides a view of the display device 2 of a first exemplary embodiment of the measuring device 1 according to the invention. A diagram 15 is displayed on the display device 2. The diagram 15 in this view contains only the coordinate system 16. A plurality of preview diagrams 11, 12, 13, 14 is presented superimposed over the diagram. In this context, the preview diagrams 11, 12, 13, 14 display the signals measured on the individual channels of the device in a simplified and reduced form. The preview diagrams 11, 12, 13, 14 in this context are real-time images of anticipated diagrams. Since the diagram 15 currently displays no signal, the preview diagrams 11, 12, 13, 14 of all available channels are displayed. The markings of the diagram 15 and the coordinate system 16 in this case are displayed in a neutral colour, because no signal is displayed in the diagram 15.

Figure 3:
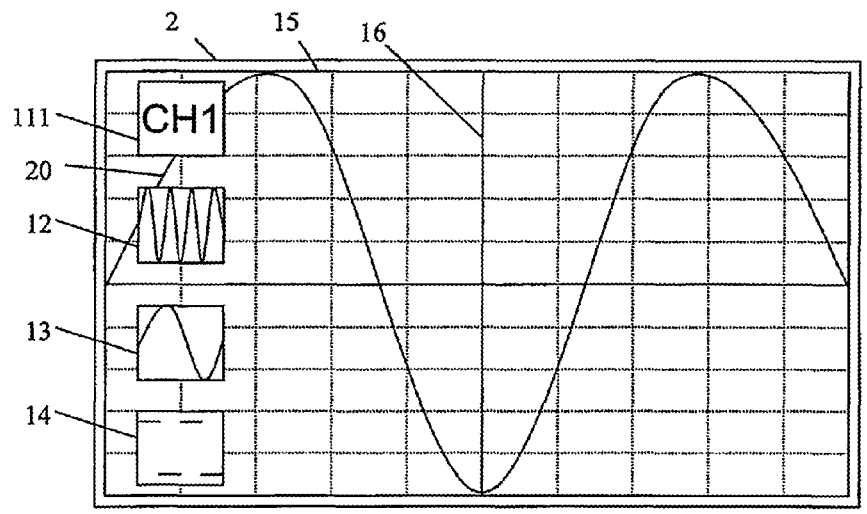
FIG. 3 provides a view of the display device of a second exemplary embodiment of the measuring device according to the invention.

FIG. 3 provides a view of the display device 2 of a second exemplary embodiment of the measuring device 1 according to the invention. The display of the allocated signal 20 as a diagram 15 is brought about by selecting one of the preview diagrams 11, 12, 13, 14. In this context, the selection is implemented by means of a pointing instrument 5 or the touch-sensitive display device 2. The diagram 15 is now displayed on the display device 2 of the measuring device 1. The diagram 15 contains the coordinate system 16 and the signal 20. The signal 20, the markings of the diagram 15 and the coordinate system 16 are displayed in the same colour here. A plurality of preview diagrams 12, 13, 14 is displayed superimposed over the diagram 15. In the place of the preview diagram 11 from FIG. 2, the channel number 111 is displayed, because the signal 20 corresponds to the preview diagram 11. Accordingly, it is evident, to which channel number 111 the displayed signal 20 corresponds. A display of the channel number 111 and of the associated signal 20 in the same colour additionally simplifies this allocation. The display of additional signal configuration parameters alongside the channel number 111 instead of the preview diagram 11 is conceivable.

Figure 4:
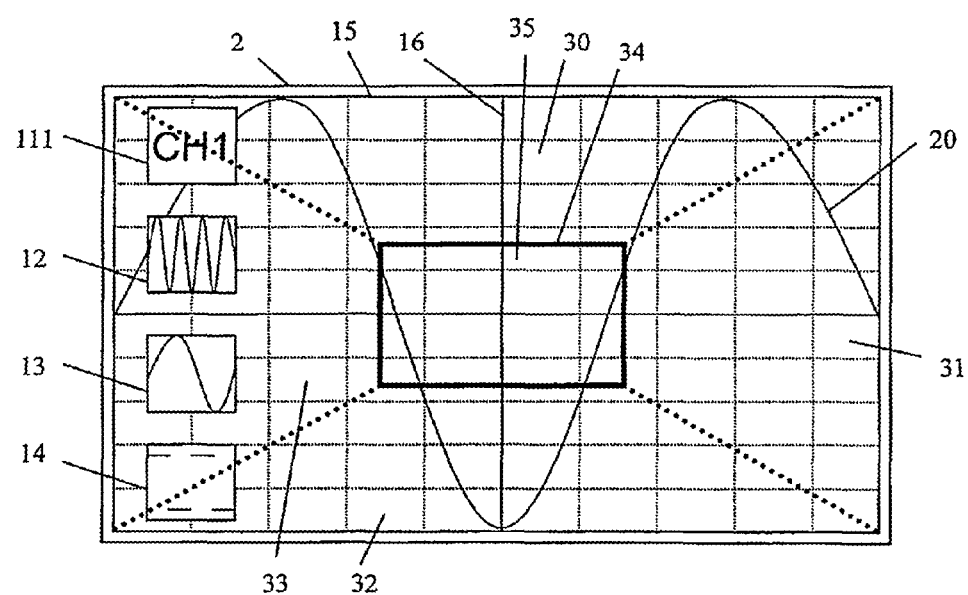
FIG. 4 provides a view of the display device of a third exemplary embodiment of the measuring device according to the invention.

FIG. 4 provides a view of the display device 2 of a third exemplary embodiment of the measuring device 1 according to the invention. If a further preview diagram 12, 13, 14 is selected in addition to the first preview diagram 11, a positioning guide 34 is displayed superimposed over the present diagram 15. Through a positioning of the selected preview diagram 12, 13, 14 in the middle sector 35 of the positioning guide 34, the signal allocated to the selected preview diagram 12, 13, 14 is displayed superimposed over the already displayed signal 20. A positioning of the selected preview diagram 12, 13, 14 in one of the lateral sectors 30, 31, 32, 33 leads to a reduction of the already displayed diagram 15 and a positioning of the diagram allocated to the selected preview diagram 12, 13, 14 at the corresponding side of the already displayed diagram 15. A partially transparent display of the preview diagrams 12, 13, 14 or respectively of the allocated channel numbers or configuration parameters in order to improve the overview is also conceivable.

Figure 5:
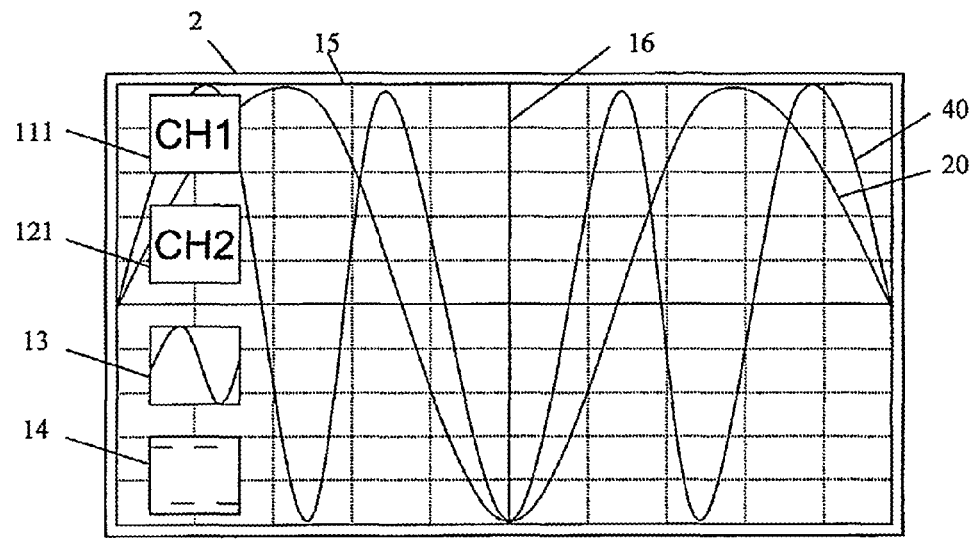
FIG. 5 provides a view of the display device of a fourth exemplary embodiment of the measuring device according to the invention.

FIG. 5 provides a view of the display device 2 of a fourth exemplary embodiment of the measuring device 1 according to the invention. Here, the result of the selection of the preview diagram 12 from FIG. 4 and a positioning of the same in the middle sector 35 of the positioning guide 34 is displayed. After the positioning of the second signal 40, which corresponds to the preview diagram 12 from FIG. 4, it is displayed in a further diagram superimposed over the signal 20. Since the diagrams are completely superimposed here, they are referred to by the common reference 15. Instead of the preview diagrams 11, 12 from FIG. 2, which correspond to the two signals 20, 40 now displayed, the channel numbers 111, 121 are displayed. In this context, the display of the respective signal 20, 40 is implemented in the same colour as the display of the channel number 111, 121. Accordingly, an easy allocation is also guaranteed with several displayed signals. Before the positioning of the second signal 40, the originally displayed signal 20 and the corresponding diagram were active. In consequence, the signal 20, the markings of the diagrams 15 and the coordinate system 16 were displayed in the same colour. After the positioning of the second signal 40 in the diagrams 15, the active signal or respectively diagram changes to the last positioned signal 40 and its associated diagram 15. Accordingly, the color of the markings of the diagrams 15 and of the coordinate system 16 also change.

Figure 6:
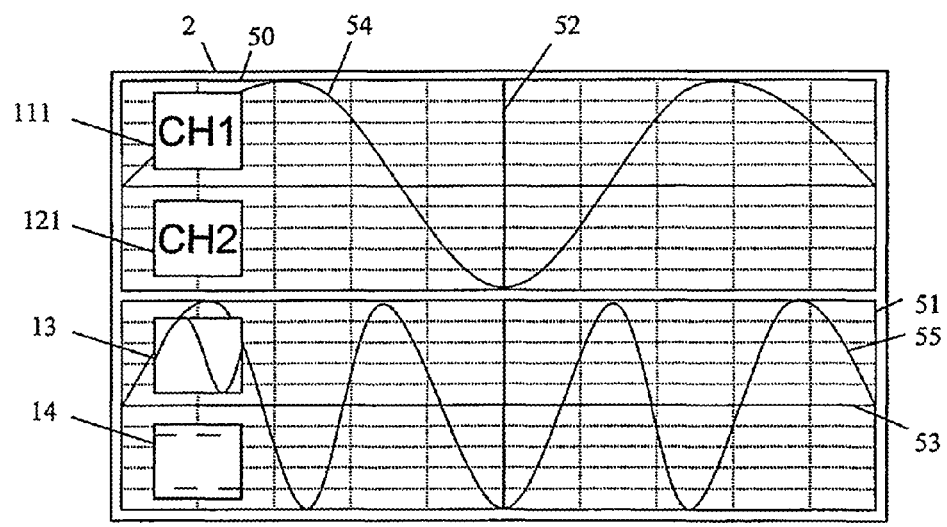
FIG. 6 provides a view of the display device of a fifth exemplary embodiment of the measuring device according to the invention.

FIG. 6 provides a view of the display device 2 of a fifth exemplary embodiment of the measuring device 1 according to the invention. The result of the selection of the preview diagram 12 from FIG. 4 and a positioning of the same in the lower sector 32 of the positioning guide 34 is displayed here. The diagram 15 from FIG. 4 is displayed here as a reduced diagram 15. Additionally, a further diagram 51 is displayed below it. In the first diagram 50, the signal 54 allocated to the first preview diagram 11 from FIG. 2 is displayed. In the second diagram 51, the signal 55 allocated to the second preview diagram 12 from FIG. 4 is displayed. Each of the displayed diagrams 50, 51 in this context provides its own coordinate system 52, 53. Here also, the two corresponding preview diagrams 11, 12 from FIG. 4 are no longer displayed. Instead, the respective numbers 111, 121 of the allocated channel are also displayed here. The channel numbers 111, 121 and the corresponding signals 54, 55 are also displayed in the same colour here. The markings of the diagrams 50, 51 and the coordinate systems 52, 53 are also displayed here in the colour of the respectively displayed, active diagram 50, 51. Since only one signal 54, 55 is displayed in each diagram 50, 51 here, the colour of this signal 54, 55 is the colour allocated to the respective diagram 50, 51.

Figure 7:
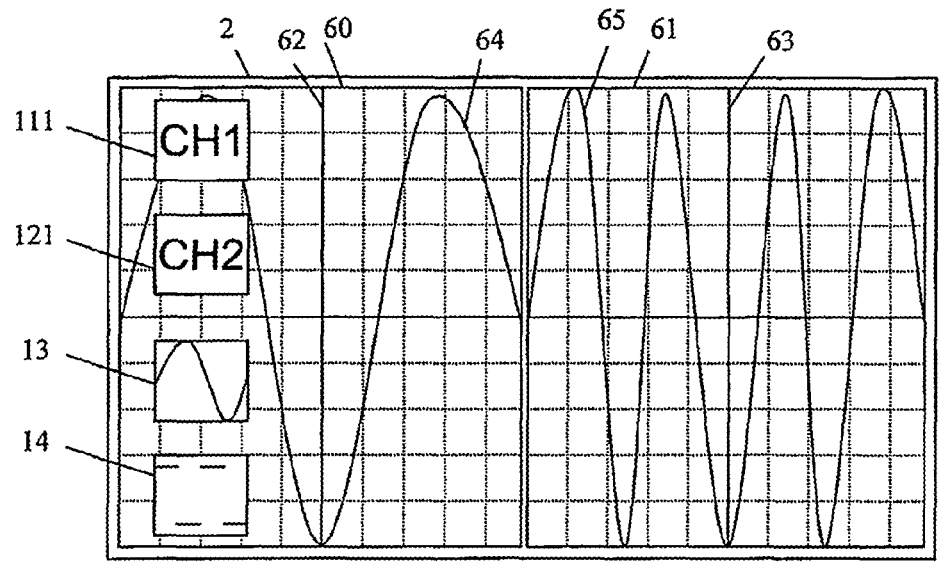
FIG. 7 provides a view of the display device of a sixth exemplary embodiment of the measuring device according to the invention.

FIG. 7 provides a view of the display device 2 of a sixth exemplary embodiment of the measuring device 1 according to the invention. Here, the result of the selection of the preview diagram 12 from FIG. 4 and of a positioning of the same in the right-hand sector 31 of the positioning guide 34 is displayed. The diagram 15 from FIG. 4 is displayed here as a reduced diagram 60. Additionally, a second diagram 61 is displayed alongside it. The signal 64 allocated to the first preview diagram 11 is displayed in the first diagram 60. The signal 65 allocated to the second preview diagram 12 is displayed in the second diagram 61. Each of the displayed diagrams 60, 61 in this context provides its own coordinate system 62, 63. Here also, the two corresponding preview diagrams 11, 12 from FIG. 4 are no longer displayed. Instead, the respective numbers 111, 121 of the associated channel are also displayed here. The colour scheme corresponds to the colour scheme shown with reference to FIG. 6.

Figure 8:
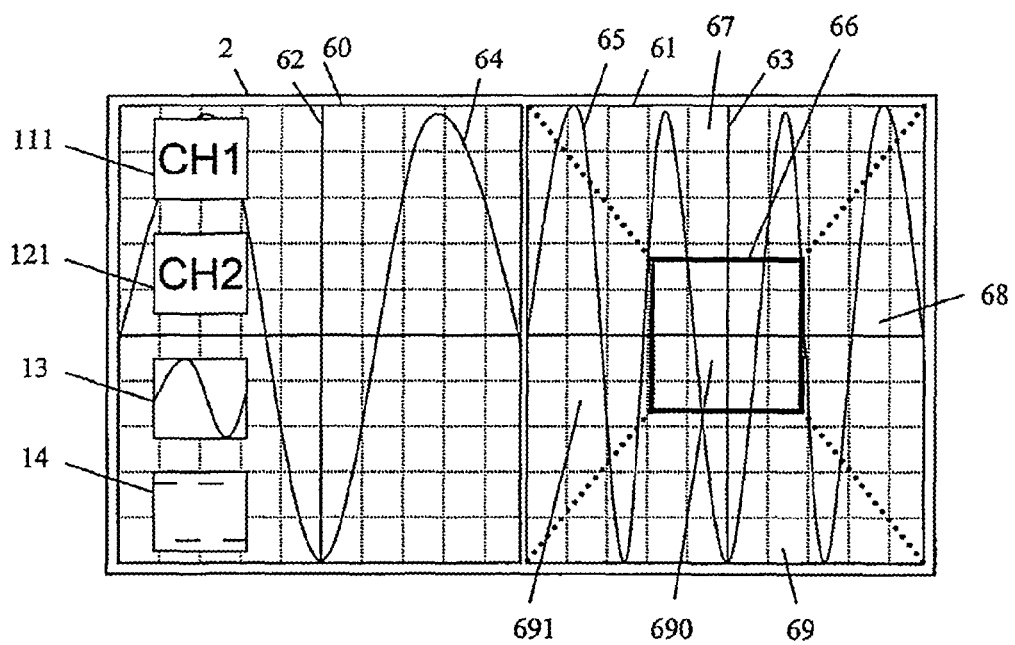
FIG. 8 provides a view of the display device of a seventh exemplary embodiment of the measuring device according to the invention.

FIG. 8 provides a view of the display device 2 of a seventh exemplary embodiment of the measuring device 1 according to the invention. If a further signal is to be displayed on the display device 2 in the form of a diagram, a further preview diagram 13 is selected. Through provisional positioning of the preview diagram 13 over the diagram 61, the positioning guide 66 appears superimposed over the diagram 61. As already explained in FIG. 4, a final positioning of the preview diagram 13 in one of the five sectors 67, 68, 69, 690, 691 is possible and in each case triggers a different arrangement of the diagrams on the display device 2.

Figure 9:
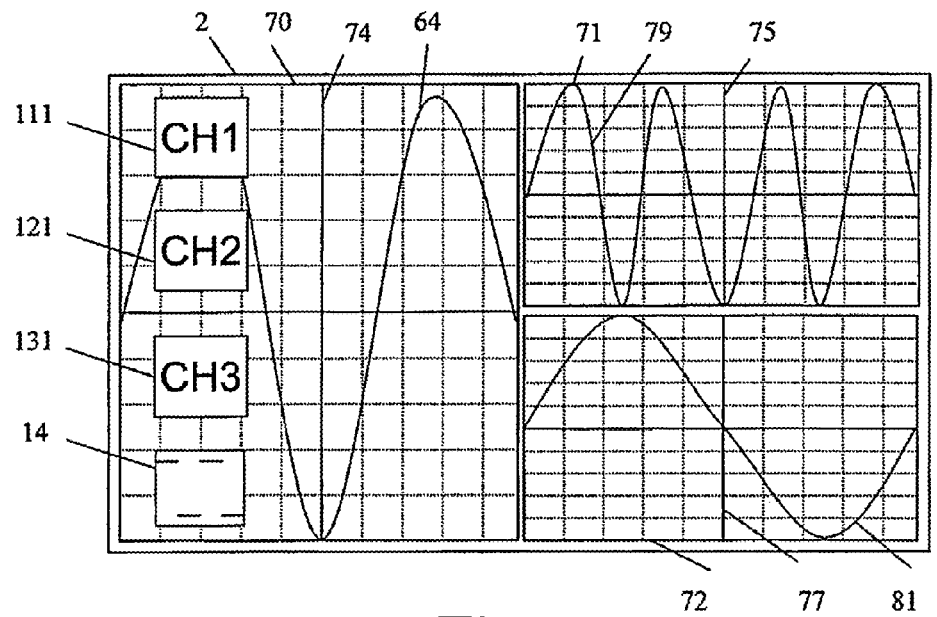
FIG. 9 provides a view of the display device of an eighth exemplary embodiment of the measuring device according to the invention.

FIG. 9 provides a view of the display device 2 of an eighth exemplary embodiment of the measuring device 1 according to the invention. With the positioning of the third preview diagram 13 from FIG. 8 in the lower sector 69 of the positioning guide 66, the diagram 61 from FIG. 8 is reduced and displayed as diagram 71. This contains the signal 79 and the coordinate system 75. The additional diagram 72 is displayed in the free space on the display device 2. The diagram 72 contains the signal 81 and the coordinate system 77. As already explained before, the preview diagram 13 is no longer displayed. Instead, the channel number 131 is shown matched in colour to the signal 81. As already shown with reference to the other drawings, in this exemplary embodiment also, the colour of the coordinate systems 74, 75, 77, the markings and the preview diagram 14 or respectively the channel numbers 111, 121, 131 correspond to the colours of the signals 64, 79, 81 in the diagrams 70, 71, 72.

Figure 10:
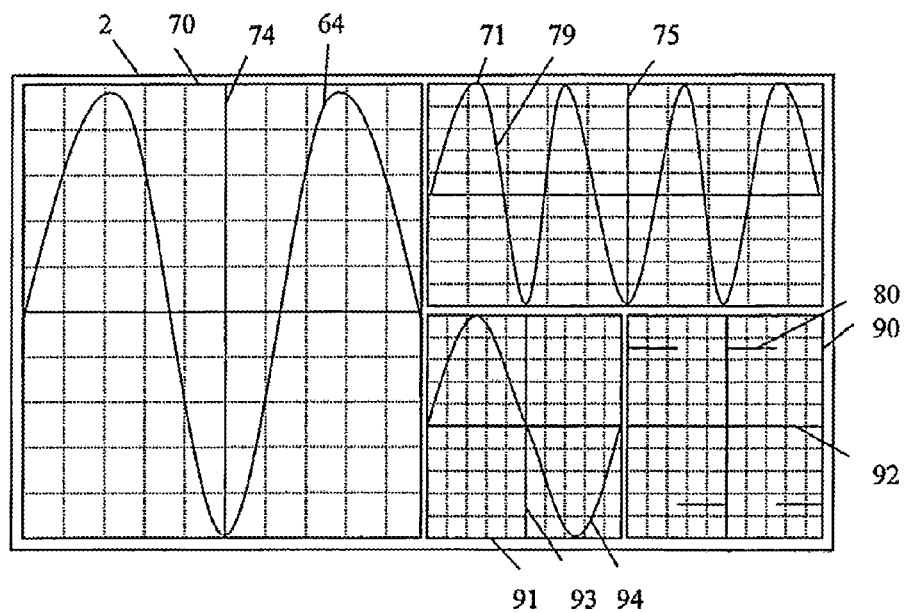
FIG. 10 provides a view of the display device of a ninth exemplary embodiment of the measuring device according to the invention.

FIG. 10 provides a view of the display device 2 of a ninth exemplary embodiment of the measuring device 1 according to the invention. If, starting from the situation displayed in FIG. 9, the fourth preview diagram 14 from FIG. 9 is selected and positioned in the right-hand lower corner of the display device 2, the arrangement of diagrams 70, 71, 90, and 91 displayed here on the display device 2 is obtained. Each of the diagrams 70, 71, 90, 91 in this context provides its own coordinate system 74, 75, 92, 93. Each of the diagrams 70, 71, 90, 91 displays its own signal 64, 79, 80, 94. In this exemplary embodiment, the preview diagrams and channel numbers have been hidden in order to obtain more space for the display of the diagrams 70, 71, 90, 91. An alternative transparent display would also be conceivable.

In order to hide a diagram again, the currently active diagram can be hidden by means of the operating element 7. As an alternative, if the allocated diagram is displayed, the respective diagram can be hidden by re-selecting a preview diagram or a channel number. In this context, if the last diagram at a position were hidden, that is to say, if no superimposed diagram is present, the corresponding diagram is removed from the display device 2 and, if possible, the diagram, which was reduced in favour of the diagram to be hidden is restored to its original size. If this is not possible, the adjacent diagram is enlarged accordingly. If the diagram to be hidden is the only diagram displayed by the display device 2, it is not hidden but continues to be displayed, wherein the signal of the diagram is hidden.

The invention is not restricted to the exemplary embodiment displayed. As already mentioned, different measuring devices can be used. For example, oscilloscopes and also spectrum analysers are conceivable. All of the features described or shown in the drawings can be combined with one another as required within the framework of the invention.

The invention claimed is:

1. A measuring device, comprising: a display device, a processing unit and at least one measurement channel,
   wherein the processing unit measures the measurement signal of the at least one measurement channel,
   wherein the display device displays the measurement signal of the at least one measurement channel as a diagram,
   wherein several diagrams can be displayed simultaneously,
   wherein preview diagrams can be additionally displayed with the display device,
   wherein the preview diagrams are reduced displays of the diagrams,
   wherein the measuring device further comprises an operating unit with at least one operating element, and
   wherein the several diagrams can be displayed side by side and/or one below the other,
   wherein the several diagrams can be displayed at different positions of the display device,
   wherein a positioning of a selected preview diagram in one of four lateral sectors of the already displayed diagram leads to a reduction of the already displayed diagram and a positioning of the diagram allocated to the selected preview diagram at the corresponding side of the already displayed diagram.

2. The measuring device according to claim 1, characterized in that
   the processing unit derives several diagrams from the measurement signal of the at least one measurement channel.

3. The measuring device according to claim 1, characterized in that
   the processing unit measures several measurement signals of several measurement channels.

4. The measuring device according to claim 3, characterized in that
   the processing unit derives a measurement signal from the measurement signals of several measurement channels.

5. The measuring device according to claim 1, characterized in that
   the preview diagrams are hidden as required.

6. The measuring device according to claim 1, characterized in that
   the preview diagrams are simplified displays of the diagrams, and
   that the preview diagrams are real-time images of the diagrams.

7. The measuring device according to claim 1, characterized in that
   the selection of the diagrams to be displayed is implemented by selection of the corresponding preview diagrams, and
   that a re-selection of a preview diagram with an already implemented display of the associated diagram triggers a removal of the associated diagram from the display device.

8. The measuring device according to claim 1, characterized in that
   the arrangement of the diagrams on the display device is implemented by positioning the preview diagrams in given regions of the display device.

9. The measuring device according to claim 8, characterized in that
   the display device is a touch-sensitive screen, and
   that the selection and positioning of the preview diagrams on the display device is implemented by touching and displacement of the preview diagrams.

10. The measuring device according to claim 8, characterized in that
    the measuring device comprises a pointing instrument (mouse), and
    that the selection and positioning of the preview diagrams on the display device is implemented by selection and displacement of the preview diagrams with the pointing instrument.

11. The measuring device according to claim 10, characterized in that
    the positioning of the diagrams is implemented by selection and displacement of the preview diagrams to given regions of the display device or to given regions of already displayed diagrams and
    that a displacement of a preview diagram on the display device without previous display of a diagram brings about the display of a diagram corresponding to the preview diagram over largely the entire display device.

12. The measuring device according to claim 11, characterized in that
  a displacement of a preview diagram to the middle of an already displayed first diagram brings about a superimposition of the first diagram and of the second diagram corresponding to the preview diagram.

13. The measuring device according to claim 11, characterized in that
  a displacement of a preview diagram to the edge of an already displayed first diagram brings about a reduction of the first diagram and a display of the second diagram corresponding to the preview diagram on the area freed by the reduction and
  that the reduction takes place in such a manner that the display of the second diagram is implemented at the side of the edge of the first diagram, to which the preview diagram has been displaced.

14. The measuring device according to claim 1, characterized in that,
  with the display of a diagram, the preview diagram corresponding to the diagram is hidden or replaced by configuration parameters.

15. The measuring device according to claim 1, characterized in that
  the display device displays the preview diagrams with an arbitrary degree of transparency determined by the processing unit, and that the display device displays the preview diagrams superimposed over the diagrams.

16. The measuring device according claim 1, characterized in that
  the operating unit of the measuring device comprises several operating elements,
  that the several operating elements can be illuminated and/or backlit with colors at least similar to the colors of the diagrams,
  that precisely one diagram displayed by the measuring device is an active diagram,
  that the last positioned or changed diagram is the active diagram, and
  that at least one operating element is illuminated or backlit with a color at least similar to the color of the active diagram.

17. The measuring device according to claim 16, characterized in that
  the active diagram is changed by selection of a diagram on the display device, and
  that, with the change of the active diagram, the illumination or backlighting of at least one operating element is changed to a color similar to the color of the active diagram.

18. A measurement method with a measuring device,
  wherein the measuring device comprises a display device, a processing unit and at least one measurement channel,
  wherein measurement signals of the at least one measurement channel are measured by the processing unit,
  wherein, by the display device, the measurement signal of the at least one measurement channel is displayed as a diagram,
  wherein several diagrams can be displayed simultaneously,
  wherein the display device additionally displays preview diagrams,
  wherein the preview diagrams are reduced displays of the diagrams,
  wherein the measuring device further comprises an operating unit with at least one operating element, and
  wherein the several diagrams are displayed side by side and/or one below the other,
  wherein the several diagrams can be displayed at different positions of the display device, and
  wherein a positioning of a selected preview diagram in one of four lateral sectors of the already displayed diagram leads to a reduction of the already displayed diagram and a positioning of the diagram allocated to the selected preview diagram at the corresponding side of the already displayed diagram.

19. The measurement method according to claim 18, characterized in that
  several diagrams can be derived from the measurement signal of the at least one measurement channel.

20. The measurement method according to claim 18, characterized in that
  several measurement signals of several measurement channels can be measured.

21. The measurement method according to claim 20, characterized in that
  a measurement signal can be derived simultaneously from the measurement signals of several measurement channels.

22. The measurement method according to claim 18, characterized in that
  the preview diagrams can be hidden if required.

23. The measurement method according to claim 22, characterized in that
  the preview diagrams are simplified displays of the diagrams, and
  that the preview diagrams are real-time images of the diagrams.

24. The measurement method according to claim 22, characterized in that
  the diagrams to be displayed are selected by selection of the corresponding preview diagrams, and that with a re-selection of a preview diagram with an already implemented display of the associated diagram, the associated diagram is removed from the display device.

25. The measurement method according to claim 24, characterized in that
  the diagrams are arranged on the display device by positioning the preview diagrams in given regions positions of the display device.

26. The measurement method according to claim 25, characterized in that
  the display device is a touch-sensitive screen, and
  that the preview diagrams are selected by touching and displacement and positioned on the display device.

27. The measurement method according to claim 25, characterized in that
  the measuring device comprises a pointing instrument (mouse), and
  that the preview diagrams are positioned on the display device by selection and displacement with the pointing instrument.

28. The measurement method according to claim 27, characterized in that
  the diagrams are positioned by selection and displacement of the preview diagrams to given regions of the display device or to given regions of already displayed diagrams and
  that a displacement of a preview diagram on the display device without previous display of a diagram brings about the display of a diagram corresponding to the preview diagram over largely the entire display device.

29. The measurement method according to claim 28, characterized in that
a displacement of a preview diagram to the middle of an already displayed first diagram brings about a superimposition of the first diagram and of the second diagram corresponding to the preview diagram.

30. The measurement method according to claim 28, characterized in that
a displacement of a preview diagram to the edge of an already displayed first diagram brings about a reduction of the first diagram and a display of the second diagram corresponding to the preview diagram on the area freed by the reduction and
that the reduction is implemented in such a manner that the display of the second diagram is implemented at the side of the edge of the first diagram, to which the preview diagram has been displaced.

31. The measurement method according to claim 18, characterized in that,
with the display of a diagram, the preview diagram corresponding to the diagram is hidden or replaced by configuration parameters.

32. The measurement method according to claim 18, characterized in that
the preview diagrams are displayed in a transparent manner, and
that the preview diagrams are displayed superimposed over the diagrams.

33. The measurement method according to claim 18, characterized in that
the operating unit of the measuring device comprises several operating elements,
that the several operating elements can be illuminated and/or backlit with colors at least similar to the colors of the diagrams,
that precisely one diagram displayed by the measuring device is an active diagram,
that the last positioned or changed diagram is the active diagram, and
that at least one operating element is illuminated or backlit with a to the color of the active diagram.

34. The measurement method according to claim 33, characterized in that
the active diagram is changed by selection of a diagram on the display device, and
that, with the change of the active diagram, the illumination or backlighting of at least one operating element changes to a color similar to the color of the active diagram.

* * * * *

UNITED STATES PATENT AND TRADEMARK OFFICE
CERTIFICATE OF CORRECTION

PATENT NO. : 8,624,580 B2
APPLICATION NO. : 12/866696
DATED : January 7, 2014
INVENTOR(S) : F. Reich et al.

It is certified that error appears in the above-identified patent and that said Letters Patent is hereby corrected as shown below:

In the Claims:

| COLUMN | LINE | ERROR |
|---|---|---|
| 10 (Claim 25, | 43 line 4) | after "regions" delete "positions" |
| 12 (Claim 33, | 15 line 13) | after "with a" insert --color at least similar-- |

Signed and Sealed this
First Day of July, 2014

Michelle K. Lee
*Deputy Director of the United States Patent and Trademark Office*